US010227687B2

(12) United States Patent
Wang et al.

(10) Patent No.: US 10,227,687 B2
(45) Date of Patent: Mar. 12, 2019

(54) HARD LUBRICATING COATING FILM AND HARD LUBRICATING COATING FILM-COVERED TOOL

(71) Applicants: Mei Wang, Toyokawa (JP); Masatoshi Sakurai, Toyokawa (JP); Yuji Sutou, Sendai (JP); Junichi Koike, Sendai (JP)

(72) Inventors: Mei Wang, Toyokawa (JP); Masatoshi Sakurai, Toyokawa (JP); Yuji Sutou, Sendai (JP); Junichi Koike, Sendai (JP)

(73) Assignees: OSG CORPORATION, Toyokawa (JP); NATIONAL UNIVERSITY CORPORATION TOHOKU UNIVERSITY, Sendai (JP)

( * ) Notice: Subject to any disclaimer, the term of this patent is extended or adjusted under 35 U.S.C. 154(b) by 73 days.

(21) Appl. No.: 15/038,839

(22) PCT Filed: Nov. 26, 2013

(86) PCT No.: PCT/JP2013/081822
§ 371 (c)(1),
(2) Date: May 24, 2016

(87) PCT Pub. No.: WO2015/079505
PCT Pub. Date: Jun. 4, 2015

(65) Prior Publication Data
US 2017/0037502 A1 Feb. 9, 2017

(51) Int. Cl.
*C23C 14/06* (2006.01)
*C23C 14/00* (2006.01)
*B23C 5/28* (2006.01)
*C23C 28/04* (2006.01)
*C23C 28/00* (2006.01)
(Continued)

(52) U.S. Cl.
CPC ............ *C23C 14/0073* (2013.01); *B23C 5/28* (2013.01); *C23C 14/06* (2013.01);
(Continued)

(58) Field of Classification Search
USPC .......... 51/307, 309; 428/216, 336, 697, 698, 428/699, 701, 702, 704; 407/119
See application file for complete search history.

(56) References Cited

U.S. PATENT DOCUMENTS 6,730,392 B2 * 5/2004 Vetter .................. C23C 28/044
428/216
2005/0170162 A1 8/2005 Yamamoto et al.
(Continued)

FOREIGN PATENT DOCUMENTS

CN 102534532 * 7/2012
EP 1947209 A1 7/2008
(Continued)

OTHER PUBLICATIONS

Jan. 7, 2014 International Search Report issued in International Patent Application No. PCT/JP2013/081822.
(Continued)

*Primary Examiner* — Archene A Turner
(74) *Attorney, Agent, or Firm* — Oliff PLC

(57) ABSTRACT

A hard lubrication film, with which a surface of a base material is coated, has two or more alternately laminated layers that are one or more A-layers made of $(Cr_aMo_bW_cV_dB_e)_{1-x-y}C_xN_y$ and one or more B-layers made of $(Cr_aMo_bW_cV_dB_e)_{1-x-y-z}C_xN_yO_z$. Atom ratios a, b, c, d, e=1−a−b−c−d, x+y, and y related to A-layers satisfy $0.2 \le a \le 0.7$, $0.05 \le b \le 0.6$, $0 \le c \le 0.3$, $0 \le d \le 0.05$, $0 \le e \le 0.05$, $0.3 \le x+y \le 0.6$, and $0 \le y \le 0.6$, respectively. Atom ratios a, b, c, d, e=1−a−b−c−d, x, y, z, and x+y+z related to B-layers satisfy $0.2 \le a \le 0.7$, $0.05 \le b \le 0.6$, $0 \le c \le 0.3$, $0 \le d \le 0.05$, $0 \le e \le 0.05$, $0 \le x \le 0.6$, $0 \le y \le 0.6$, $0 < z \le 0.6$, and $0.3 \le x+y+z \le 0.6$, respectively. Each A-layer has a film thickness within a range of 2 nm or more to 1000 nm or less, each B-layer has a film thickness within a range of 2 nm or more to 500 nm or less, and wherein the (Continued)

hard lubrication film has a total film thickness within a range of 0.1 μm or more to 10.0 μm or less.

5 Claims, 10 Drawing Sheets

(51) Int. Cl.
  *C23C 14/34* (2006.01)
  *C23C 14/50* (2006.01)
(52) U.S. Cl.
  CPC ...... *C23C 14/0635* (2013.01); *C23C 14/0641* (2013.01); *C23C 14/0664* (2013.01); *C23C 14/0676* (2013.01); *C23C 14/345* (2013.01); *C23C 14/505* (2013.01); *C23C 28/042* (2013.01); *C23C 28/044* (2013.01); *C23C 28/42* (2013.01); *B23C 2228/04* (2013.01); *B23C 2228/08* (2013.01); *B23C 2228/10* (2013.01)

(56) References Cited

U.S. PATENT DOCUMENTS

| | | |
|---|---|---|
| 2009/0317659 A1 | 12/2009 | Yamamoto |
| 2013/0052455 A1* | 2/2013 | Gates, Jr. ............... C23C 16/36 428/698 |
| 2013/0287507 A1* | 10/2013 | Lind ................... C23C 14/0021 407/119 |
| 2015/0044508 A1* | 2/2015 | Takazaki ............. C23C 14/0015 428/697 |

FOREIGN PATENT DOCUMENTS

| | | | |
|---|---|---|---|
| JP | 2003-165003 | * | 6/2003 |
| JP | 2008-240157 A | | 10/2008 |
| JP | 2010-001547 A | | 1/2010 |
| JP | 2011-256424 A | | 12/2011 |
| JP | 2012-115923 A | | 6/2012 |
| JP | 2012-115924 A | | 6/2012 |
| WO | 2010/150411 A1 | | 12/2010 |
| WO | 2013/140989 | * | 9/2013 |

OTHER PUBLICATIONS

Hui Xia et al., "Substrate effect on the microstructure and electrochemical properties of LiCoO2 thin films grown by PLD," Journal of Alloys and Compounds 417, (2006), pp. 304-310.

G. Yildirim et al., "Substrate effect on microstructure and optical performance of sputter-deposited TiO2 thin films," Cryst. Res. Technol. 47, No. 2, pp. 195-201, 2012.

* cited by examiner

US 10,227,687 B2

HARD LUBRICATING COATING FILM AND HARD LUBRICATING COATING FILM-COVERED TOOL

TECHNICAL FIELD

The present invention relates to a hard lubrication film disposed as coating on a surface of a base material and a hard lubrication film coated tool coated with the hard lubrication film and particularly to an improvement for increasing both hardness and abrasion resistance thereof.

BACKGROUND ART

Cutting tools such as drills and taps cutting materials such as carbon steel, stainless steel, and mild steel are required to have properties such as hardness necessary for cutting a work material and abrasion resistance leading to an extended tool life. Therefore, base material surfaces of cutting tools are coated with hard films for increasing the abrasion resistance. TiN-based, CrN-based, and TiAlN-based coatings are widely used for the hard films for cutting tools and improvements are made for further increasing the performance thereof. For example, this corresponds to hard laminated films described in Patent Documents 1 and 2.

For example, Patent Document 1 proposes a hard laminated film made up of a multi-layer film having two or more alternately laminated layers that are one or more first layers made of nitride or carbonitride of $Ti_a Cr_b Al_c Mo_{1-a-b-c}$ and one or more second layers made of nitride or carbonitride of $Ti_d Cr_e Al_{1-d-e}$, and Patent Document 2 proposes a hard laminated film made up of a single layer film made of nitride or carbonitride of $Ti_a Cr_b Al_c Mo_{1-a-b-c}$.

PRIOR ART DOCUMENTS

Patent Documents

Patent Document 1: Japanese Laid-Open Patent Publication No. 2012-115924
Patent Document 2: Japanese Laid-Open Patent Publication No. 2012-115923

SUMMARY OF THE INVENTION

Problem to Be Solved By the Invention

However, base materials with hard laminated films formed by the conventional techniques as described above still have insufficient lubricity and abrasion resistance and therefore have a problem that cutting tools made of the base materials reach the life earlier due to damage and abrasion. Thus, it has been required to develop a hard laminated film having hardness and abrasion resistance.

The present invention was conceived in view of the situations and it is therefore an object of the present invention to provide a hard lubrication film and a hard lubrication film coated tool having hardness and abrasion resistance.

Means for Solving the Problem

As a result of intensive studies in view of the situations, the present inventors found the fact that when chromium (Cr), molybdenum (Mo), tungsten (W), vanadium (V), and boron (B) are used as constituent elements of an A-layer and a B-layer with intent to exclude titanium (Ti) from the elements making up a film because of susceptibility to oxidation of Ti and oxygen is further introduced into the B-layer, a microstructure of oxide, oxycarbide, oxynitride, or oxycarbonitride of Cr, Mo, W, V, and B is formed, or a dual-phase structure in which a crystal phase and an amorphous phase are mixed is formed in the B-layer, and thus, hardness and higher lubricity can be achieved at the same time. The present invention was conceived based on such a knowledge.

That is, a first aspect of the invention provides a hard lubrication film with which a surface of a base material is coated, the hard lubrication film having two or more alternately laminated layers that are one or more A-layers made of $(Cr_a Mo_b W_c V_d B_e)_{1-x-y} C_x N_y$ and one or more B-layers made of $(Cr_a Mo_b W_c V_d B_e)_{1-x-y-z} C_x N_y O_z$, wherein atom ratios a, b, c, d, e=1−a−b−c−d, x+y, and y related to the A-layers satisfy $0.2 \leq a \leq 0.7$, $0.05 \leq b \leq 0.6$, $0 \leq c \leq 0.3$, $0 \leq d \leq 0.05$, $0 \leq e \leq 0.05$, $0.3 \leq x+y \leq 0.6$, and $0 \leq y \leq 0.6$, respectively, wherein atom ratios a, b, c, d, e=1−a−b−c−d, x, y, z, and x+y+z related to the B-layers satisfy $0.2 \leq a \leq 0.7$, $0.05 \leq b \leq 0.6$, $0 \leq c \leq 0.3$, $0 \leq d \leq 0.05$, $0 \leq e \leq 0.05$, $0 \leq x \leq 0.6$, $0 \leq y \leq 0.6$, $0 \leq z \leq 0.6$, and $0.3 \leq x+y+z \leq 0.6$, respectively, and wherein each of the A-layers has a film thickness within a range of 2 nm or more to 1000 nm or less, wherein each of the B-layers has a film thickness within a range of 2 nm or more to 500 nm or less, and wherein the hard lubrication film has a total film thickness within a range of 0.1 μm or more to 10.0 μm or less.

A second aspect of the invention provides the hard lubrication film recited in the first aspect of the invention, wherein the B-layers have a crystal phase and an amorphous phase mixed.

ADVANTAGEOUS EFFECTS OF THE INVENTION

As described above, the hard lubrication film recited in the first aspect of the invention is formed by alternately laminating two or more layers that are the one or more A-layers made of nitride, carbide, or carbonitride of $(Cr_a Mo_b W_c V_d B_e)_{1-x-y} C_x N_y$ and the one or more B-layers made of oxide, oxynitride, oxycarbide, or oxycarbonitride of $(Cr_a Mo_b W_c V_d B_e)_{1-x-y-z} C_x N_y O_z$; and therefore, the laminated A-layers have nitride, carbide, or carbonitride of CrMoWVB formed therein and the laminated B-layers have a microstructure made of oxide, oxycarbide, oxynitride, or oxycarbonitride of Cr, Mo, W, V and B formed therein or a dual-phase structure of oxide, oxycarbide, oxynitride or oxyxarbonitride of Cr, Mo, W, V and B formed therein between the crystal phase of the NaCl structure (such as δ-(Cr, Mo, W, V)N and γ-Mo$_2$N) and the amorphous phase, so that the hard lubrication film and the hard lubrication film coated tool having hardness and abrasion resistance can be acquired.

According to the hard lubrication film recited in the second aspect of the invention, the B-layers have a dual-phase structure in which the crystal phase and the amorphous phase are mixed. Consequently, since the laminated B-layers have a dual-phase structure of oxide, oxycarbide, oxynitride or oxycarbonitride of Cr, Mo, W, V and B formed therein between the crystal phase of the NaCl structure (such as δ-(Cr, Mo, W, V)N and γ-Mo$_2$N) and the amorphous phase, the hard lubrication film and the hard lubrication film coated tool having hardness and abrasion resistance can be acquired.

BRIEF DESCRIPTION OF DRAWINGS

FIG. 8A shows the photograph taken by a microscope; FIG. 8B shows the photograph taken by a scanning electron microscope (SEM); and FIG. 8C shows the photograph of oxygen analysis results of the EDS analysis with the SEM.

FIG. 9A shows the photograph taken by a microscope; FIG. 9B shows the photograph taken by a scanning electron microscope (SEM); and FIG. 9C shows the photograph of oxygen analysis results of the EDS analysis with the SEM.

FIG. 10A shows the photograph taken by a microscope; FIG. 10B shows the photograph taken by a scanning electron microscope (SEM); and FIG. 10C shows the photograph of oxygen analysis results of the EDS analysis with the SEM.

MODE FOR CARRYING OUT THE INVENTION

Figure 1:
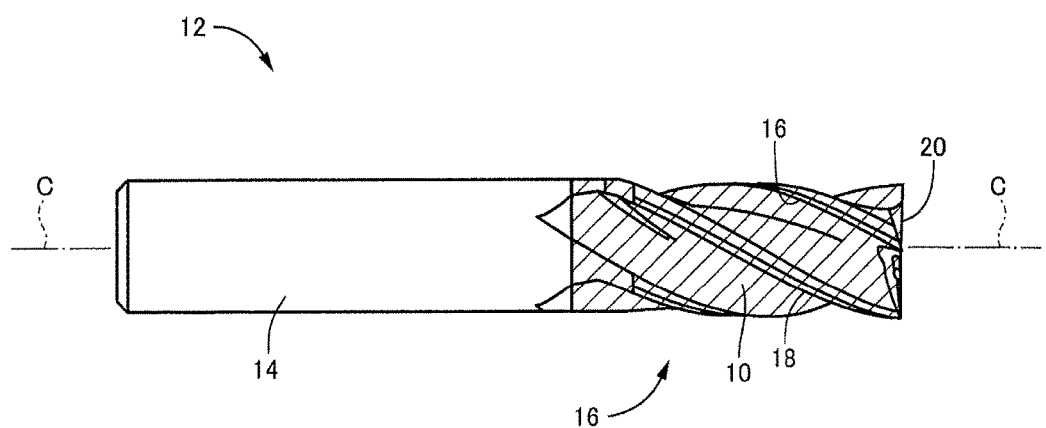
FIG. 1 is a front view of an end mill coated with a hard lubrication film that is an embodiment of the present invention viewed in a direction perpendicular to an axis C thereof.

An embodiment of a hard lubrication film of the present invention will now be described in detail with reference to the drawings.
Embodiment FIG. 1 is a front view of an end mill 12 coated with a hard film 10 that is an embodiment of the present invention viewed in a direction perpendicular to an axis C of the end mill 12. As shown in FIG. 1, the end mill 12 is a rotary cutting tool having a shank and a cutting portion 16 integrally disposed on a tool base material 14 made of cemented carbide, for example. This cutting portion 16 includes a peripheral cutting edge 18 and an end cutting edge 20 as cutting edges and is attached to a cutting apparatus not shown and rotationally driven around the axis C by the cutting apparatus to perform cutting of a work material with the peripheral cutting edge 18 and the end cutting edge 20. The hard film 10, the tool base material 14, and the end mill 12 correspond to a hard lubrication film of the present invention, a base material of the present invention, and a hard lubrication film coated tool of the present invention, respectively.

Figure 2:
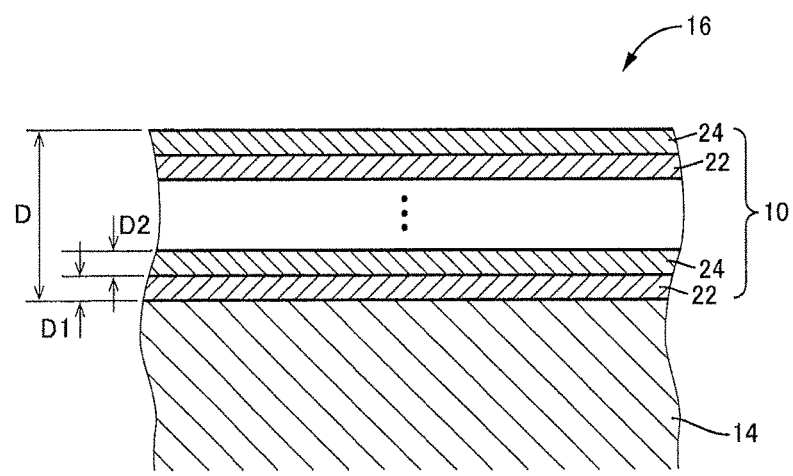
FIG. 2 is a conceptual cross-sectional diagram for explaining a lamination structure of a surface portion of the end mill of FIG. 1.

FIG. 2 is a conceptual cross-sectional diagram for explaining a lamination structure of a surface portion of the end mill 12 of FIG. 1. As shown in FIG. 2, the end mill 12 has a surface coated with the hard film 10 covering the surface. A shaded area of FIG. 1 indicates a portion disposed with the hard film 10 on the end mill 12 and, preferably, the hard film 10 is disposed as coating on the surface of the tool base material 14 corresponding to the cutting portion 16 of the end mill 12.

As apparent from FIG. 2, the hard film 10 of this embodiment is a multi-layer film having two or more alternately laminated layers that are one or more A-layers 22 not containing an oxygen element and one or more B-layers 24 containing an oxygen element, and the A-layers 22 and the B-layers 24 are made of materials satisfying the following chemical compositions. In particular, the A-layers 22 are made of $(Cr_aMo_bW_cV_dB_e)_{1-x-y}C_xN_y$, that is nitride, carbide, or carbonitride, and atom ratios a, b, c, d, e=1−a−b−c−d, x+y, and y satisfy $0.2 \leq a \leq 0.7$, $0.05 \leq b \leq 0.6$, $0 \leq c \leq 0.3$, $0 \leq d \leq 0.05$, $0 \leq e \leq 0.05$, $0.3 \leq x+y \leq 0.6$, and $0 \leq y \leq 0.6$. The A-layers 22 of the hard film 10 are preferably exemplified by $(Cr_{0.4}Mo_{0.6})_{0.52}N_{0.48}$, for example. The B-layers 24 are made of $(Cr_aMo_bW_cV_dB_e)_{1-x-y-z}C_xN_yO_z$, that is oxide, oxynitride, oxycarbide, or oxycarbonitride, and atom ratios a, b, c, d, e=1−a−b−c−d, x, y, z, and x+y+z satisfy $0.2 \leq a \leq 0.7$, $0.05 \leq b \leq 0.6$, $0 \leq c \leq 0.3$, $0 \leq d \leq 0.05$, $0 \leq e \leq 0.05$, $0 \leq x \leq 0.6$, $0 \leq y \leq 0.6$, $0 \leq z \leq 0.6$, and $0.3 \leq x+y+z \leq 0.6$. The B-layers 24 of the hard film 10 are preferably exemplified by $(Cr_{0.4}Mo_{0.6})_{0.49}N_{0.25}O_{0.26}$, etc.

In the hard film 10, a film thickness D1 of each of the A-layers 22 is within a range of 2 nm or more to 1000 nm or less, a film thickness D2 of each of the B-layers 24 is within a range of 2 nm or more to 500 nm or less, and a total film thickness D of the hard film 10 is within a range of 0.1 μm or more to 10.0 μm or less. In particular, although the laminated layer numbers of the A-layers 22 and the B-layers 24 are appropriately defined as long as the numbers do not deviate from the numerical value ranges related to the total film thickness D of the hard film 10 and the film thicknesses D1, D2 of the respective film layers 22, 24, the hard film 10 may be a multi-layer film having the at least one A-layer 22 and the at least one B-layer 24. The film thickness D1 may be equal for all the A-layers 22 in the hard film 10 or may vary within the numerical value ranges. Similarly, the film thickness D2 may be equal for all the B-layers 24 in the hard film 10 or may vary within the numerical value ranges.

With regard to the order of lamination of the A-layers 22 and the B-layers 24 in the hard film 10, preferably, as shown in FIG. 2, the layers are laminated in the order of the A-layer 22, the B-layer 24, . . . , the A-layer 22, and the B-layer 24 from the tool base material 14 side. Therefore, a base layer (bottom layer contacting the tool base material 14) of the hard film 10 is the A-layer and a surface layer (top layer of the hard film 10) is the B-layer.

Figure 3:
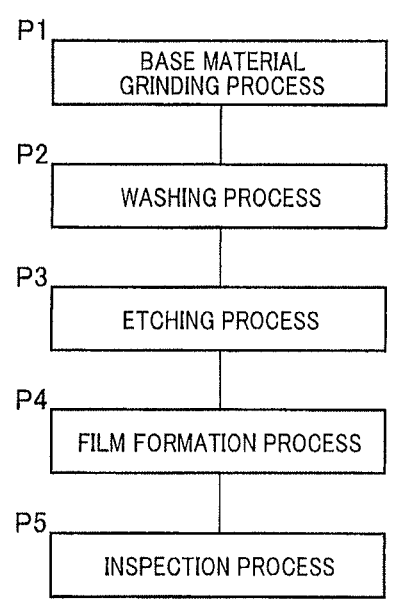
FIG. 3 is a process chart for forming the end mill of FIG. 1.
Figure 4:
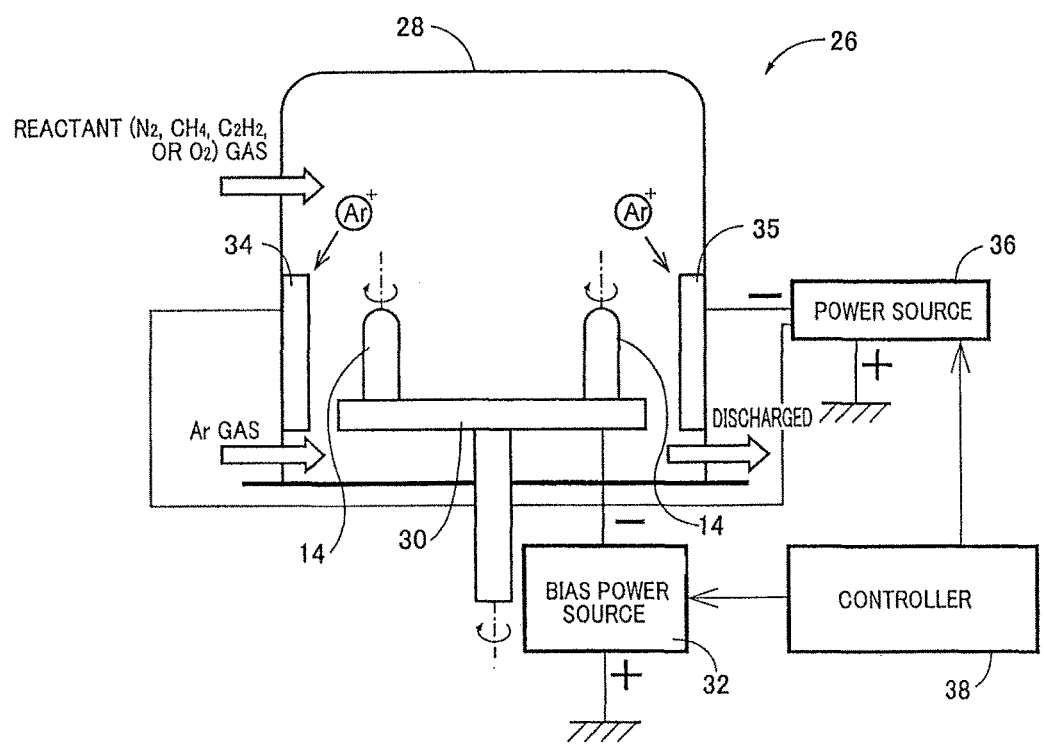
FIG. 4 is a general configuration diagram for explaining a sputtering apparatus preferably used for forming the end mill of FIG. 1.

Processes of forming the end mill 12 having the cutting portion 16 of the tool base material 14 coated with the hard film 10 will be described in detail with reference to FIGS. 3 and 4. FIG. 3 is a process chart for forming the end mill 12 of FIG. 1 and FIG. 4 is a general configuration diagram (schematic) for explaining a sputtering apparatus 26 preferably used for forming the end mill 12 of FIG. 1.

In a base material grinding process P1 of FIG. 3, cemented carbide used as a base material of the tool base material 14 is subjected to grinding to acquire the tool base material 14. For example, first, the cemented carbide is subjected to cylindrical grinding to form a rough shape of the tool base material 14, i.e., a columnar shape having an axial center. Subsequently, the cemented carbide is subjected to groove grinding for forming helical flutes etc. on an outer circumferential side surface on one end side of the columnar shape. Lastly, tips of convex portions generated by forming the flutes are subjected to cutting-edge grinding so that the convex portions are formed into peripheral cutting edges and end cutting edges for cutting a work material. In a washing process P2, the surface of the tool base material 14 is washed before being coated with the hard film 10. In an etching process P3, the surface of the tool base material 14 is roughened as pretreatment by the sputtering apparatus 26. In a film formation process P4 of the film 10, the cutting portion of the tool base material 14 is coated with the hard film 10 by the sputtering apparatus 26 to form the end mill 12. In an inspection process P5, an inspection is performed for determining whether the end mill 12 coated with the hard film 10 satisfies a usage standard for a cutting tool.

The etching process P3 and the film formation process P4 for the film executed by the sputtering apparatus 26 will be described in more detail with reference to FIG. 4. The sputtering apparatus 26 includes a chamber 28, a rotation shaft penetrating through a through-hole at a substantially center of a bottom surface of the chamber 28, and a disk-shaped base 30 fixedly disposed at one end of the rotation shaft inside the chamber 28. First, on the disk-shaped base 30, a plurality of the tool base materials 14 acquired in the grinding process P1 are disposed on the base 30 at regular circumferential intervals from each other along a circumference having an equal distance from the center of the base 30 such that each tool base materials 14 can rotate on its own axis. The tool base materials 14 are raised in temperature to about 500° C. by a heater not shown and an argon (Ar) gas is introduced into the chamber 28 while the inside of the chamber 28 is maintained at a degree of vacuum equal to or less than a predetermined pressure. In this state, a bias power source 32 applies a bias voltage of, for example, −200 to −500 V, to the tool base materials 14 to perform the etching treatment of the surfaces of the tool base materials 14 with Ar ions generated by glow discharge occurring in the Ar gas. After completion of the etching process, the Ar gas is discharged from the chamber 28. After the etching process P3 is completed as described above, the film formation process P4 of the film is continuously executed. In particular, a constant cathode voltage (e.g., about −100 to −500 V) is applied by a power source 36 to targets 34, 35 such as Cr and Mo making up the hard film 10 while a constant negative bias voltage (e.g., about −100 V) is applied by the bias power source 32 to the tool base materials 14 so as to cause the argon ions Ar+ to collide with the targets 34, 35, thereby beating out and ionizing the constituent substances such as Cr and Mo. The voltages applied by the power source 36 and the bias power source 32 are controlled by a controller 38. Into the chamber 28, nitrogen gas ($N_2$), hydrocarbon gas ($CH_4$, $C_2H_2$), and/or oxygen gas ($O_2$) are/is selectively introduced as a reactant gas in addition to the argon gas at a predetermined flow rate and pressure so that nitrogen atoms (N), carbon atoms (C), and/or oxygen atoms (O) bind to Cr, Mo, etc. beaten out from the targets 34, 35, to form a nitride such as $(Cr_{0.4}Mo_{0.6})_{0.52}N_{0.48}$ and a carbide such as $(Cr_{0.55}Mo_{0.45})_{0.6}C_{0.4}$ as the A-layers 22, for example, and to form an oxynitride such as $(Cr_{0.4}Mo_{0.6})_{0.49}N_{0.25}O_{0.26}$ as the B-layers 24, for example. Since the tool base material 14 is placed on the base 30 rotated relative to the chamber 28 and the tool base material 14 itself is rotated relative to the base 30, the layers are allowed to coat the surfaces of the tool base materials 14 as the homogeneous hard films 10. The two kinds of the coatings, that is, the A-layers 22 and the B-layers 24 are performed through the control of composition ratios related to Cr, Mo, W, V, and B and the control of the corresponding reactant gases during film formation or only through the control of the corresponding reactant gases during film formation. For example, since the oxygen (O) gas is not necessary for the reactant gas at the time of coating with the A-layers 22, the introduction of the oxygen (O) gas into the chamber 28 is turned off to form the A-layers 22. The tool base materials 14 are alternately and repeatedly coated with the A-layers 22 and the B-layers 24 in accordance with switching of the reactant gas and selection of the targets 34, 35, and the end mill 12 coated with the hard film 10 is finally formed.

Since the hard film 10 used for coating the end mill 12 in this way is formed by alternately laminating the A-layers 22 made of nitride, carbide, or carbonitride of $(Cr_aMo_b W_cV_dB_e)_{1-x-y}C_xN_y$, and the B-layers 24 made of oxide, oxynitride, oxycarbide, or oxycarbonitride of $(Cr_aMo_b W_cV_dB_e)_{1-x-y-z}C_xN_yO_z$, a microstructure of 1 nm or less is formed as an intermediate layer between the A-layer 22 and the B-layer 24, resulting in the excellent abrasion resistance and thus the improved tool life of the end mill 12. Since the hard film 10 is formed by lamination of the A-layers 22 and the B-layers 24 controlled by the presence/absence of introduction of the reactant gas in the sputtering apparatus 26, the hard film 10 is excellent in interface smoothness and adhesiveness between layers of the A-layers 22 and the B-layers 24 and therefore has high hardness as well as excellent abrasion resistance and toughness.

Description will be made of tests conducted by the present inventors for verifying the effect of the present invention with reference to FIGS. 5 to 11, Table 1, and Table 2.

Table 1 describes thin film compositions of the A-layers and the B-layers of test products 1 to 40 and comparison products 1 to 6 used in the tests and Table 2 describes respective film thicknesses and total film thicknesses of the A-layers and the B-layers as well as test results of the test products 1 to 40 and the comparison products 1 to 6. The test products 1 to 40 satisfy the conditions (requirements) of film structures and film thicknesses of the hard film 10 and the comparison products 1 to 6 do not satisfy the conditions required for the hard film 10.

Film hardness H (GPa) in Table 2 was obtained as follows. First, a hemispheric end surface of a test piece made up of a cemented carbide pin of 6 mmφ in diameter was coated with a hard film such that the conditions of film structures and film thicknesses described in Table 1 are satisfied, so as to produce each of test pieces 40 of the test products 1 to 40 and the comparison products 1 to 6 used in a film hardness test with the same processes as those shown in P2, P3, and P4 of FIG. 3. The film hardness of each of the produced test pieces 40 was measured in accordance with a nanoindentation method. In particular, a triangular pyramid type (Berkovich type) indenter having a tip made of a diamond tip is pressed into the surface of the test piece 40 coated with the hard film by a load P to calculate a projection area A under the indenter. The load P is divided by the area A to calculate the film hardness H (GPa).

A friction coefficient μ in Table 2 was obtained by performing a friction abrasion test as follows. First, a hemispheric end surface of a test piece was coated with a hard film such that the conditions of film structures and film thicknesses described in Table 1 are satisfied, so as to produce each of the test pieces 40 corresponding to the test products 1 to 40 and the comparison products 1 to 6. Each of the produced test pieces 40 was set on a pin-on-disk type abrasion friction tester 42.

Figure 5:
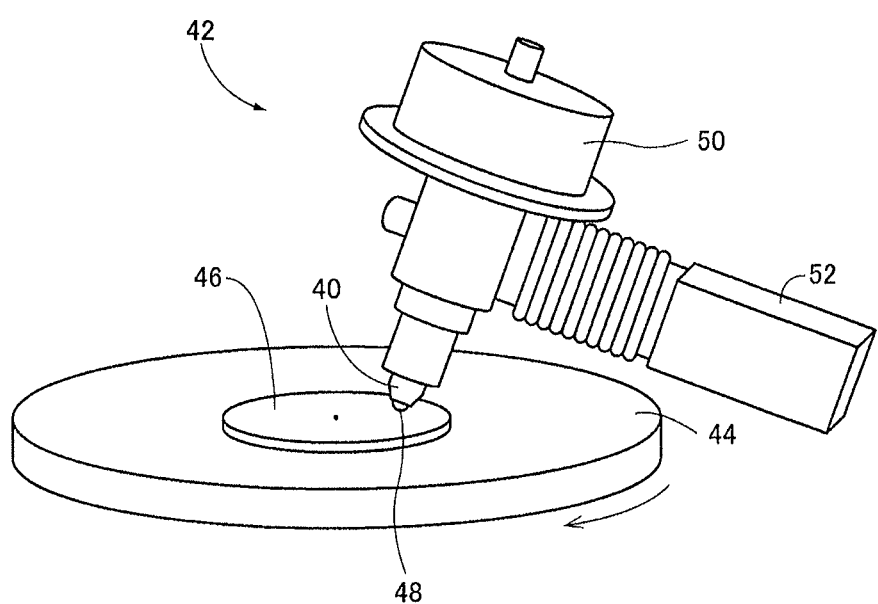
FIG. 5 is a diagram of a configuration of an abrasion friction tester used in a friction abrasion test for verifying the effect of the present hard film.

FIG. 5 is a diagram of a configuration of the abrasion friction tester 42. In FIG. 5, the abrasion friction tester 42 includes a disk-shaped rotary stage 44 rotationally driven around a rotation center thereof, a work material 46 fixed to a center portion of the rotary stage 44, a load weight 50 pressing a hemispherical end portion 48 coated with each of the hard films of the test products 1 to 40 and the comparison products 1 to 6 with a predetermined applied load W obliquely at a predetermined angle from a rotation axis of the rotary stage 44 at a position shifted from a rotation center of the work material 46, and a stress sensor 52 detecting a tensile force F applied to the hemispherical end portion 48 of the test piece 40 pressed against the rotary stage 44 when the rotary stage 44 is rotated at a predetermined linear velocity. The tensile force F measured by the abrasion friction tester 42 is divided by the applied load W to calculate the friction coefficient $\mu$ (=F/W). In this test, the friction abrasion test was performed under the following test conditions.

[Test Conditions]
Test piece 40: carbide indenter (6 mm$\varphi$ in diameter)
Work material 46: S45C (25 mm$\varphi$ in diameter)
Applied load W: 2 (N)
Linear velocity: 250 (mm/min)
Test time: 600 (s)
Temperature: 21 (° C.)
Humidity: 52 (%)

In the friction abrasion test, the friction coefficients $\mu$ of the test products 1 to 40 and the comparison products 1 to 6 were evaluated in terms of an average value of the friction coefficients measured between 200 seconds and 600 seconds after the start of the test.

Abrasion depth in Table 2 was obtained as follows. A laser microscope was used for measuring an abrasion depth (nm) of an abrasion mark on the hard film due to friction with the work material 46 on the hemispherical end portions 48 of the test products 1 to 40 and the comparison products 1 to 6 used in the friction abrasion test.

TABLE 1

| | A-LAYER THIN FILM COMPOSITION $X_{1-x-y}C_xN_y$ | | | | | | | | B-LAYER THIN FILM COMPOSITION $X_{1-x-y-z}C_xN_yO_z$ COMPOSITION OF Y $Cr_aMo_bW_cV_dB_e$ |
|---|---|---|---|---|---|---|---|---|---|
| | COMPOSITION OF X $Cr_aMo_bW_cV_dB_e$ | | | | | Cx | Ny | | |
| TEST PRODUCT | Cr (a) | Mo (b) | W (c) | V (d) | B (e) | C (x) | N (y) | x + y | Cr (a) |
| TEST PRODUCT 1 | 0.4 | 0.6 | 0 | 0 | 0 | 0 | 0.5 | 0.48 | 0.4 |
| TEST PRODUCT 2 | 0.45 | 0.55 | 0 | 0 | 0 | 0.1 | 0.2 | 0.3 | 0.45 |
| TEST PRODUCT 3 | 0.5 | 0.5 | 0 | 0 | 0 | 0.2 | 0.1 | 0.3 | 0.5 |
| TEST PRODUCT 4 | 0.55 | 0.45 | 0 | 0 | 0 | 0.4 | 0 | 0.4 | 0.55 |
| TEST PRODUCT 5 | 0.6 | 0.4 | 0 | 0 | 0 | 0.3 | 0.1 | 0.3 | 0.6 |
| TEST PRODUCT 6 | 0.65 | 0.35 | 0 | 0 | 0 | 0.2 | 0.2 | 0.4 | 0.65 |
| TEST PRODUCT 7 | 0.7 | 0.3 | 0 | 0 | 0 | 0 | 0.5 | 0.5 | 0.7 |
| TEST PRODUCT 8 | 0.5 | 0.3 | 0.2 | 0 | 0 | 0.1 | 0.4 | 0.5 | 0.5 |
| TEST PRODUCT 9 | 0.5 | 0.2 | 0.3 | 0 | 0 | 0.2 | 0.2 | 0.4 | 0.6 |
| TEST PRODUCT 10 | 0.65 | 0.2 | 0.15 | 0 | 0 | 0.3 | 0.2 | 0.5 | 0.65 |
| TEST PRODUCT 11 | 0.5 | 0.3 | 0.2 | 0 | 0 | 0.4 | 0.2 | 0.6 | 0.5 |
| TEST PRODUCT 12 | 0.55 | 0.35 | 0.1 | 0 | 0 | 0 | 0.5 | 0.5 | 0.55 |
| TEST PRODUCT 13 | 0.65 | 0.05 | 0.3 | 0 | 0 | 0 | 0.3 | 0.3 | 0.6 |
| TEST PRODUCT 14 | 0.65 | 0.3 | 0.05 | 0 | 0 | 0 | 0.3 | 0.3 | 0.65 |
| TEST PRODUCT 15 | 0.6 | 0.35 | 0.05 | 0 | 0 | 0.3 | 0 | 0.3 | 0.6 |
| TEST PRODUCT 16 | 0.4 | 0.55 | 0.05 | 0 | 0 | 0.5 | 0.1 | 0.6 | 0.4 |
| TEST PRODUCT 17 | 0.35 | 0.6 | 0.05 | 0 | 0 | 0 | 0.4 | 0.4 | 0.35 |
| TEST PRODUCT 18 | 0.38 | 0.6 | 0.02 | 0 | 0 | 0 | 0.3 | 0.3 | 0.38 |
| TEST PRODUCT 19 | 0.5 | 0.45 | 0.03 | 0.02 | 0 | 0.6 | 0 | 0.6 | 0.5 |
| TEST PRODUCT 20 | 0.6 | 0.38 | 0.02 | 0 | 0 | 0.6 | 0 | 0.55 | 0.6 |
| TEST PRODUCT 21 | 0.2 | 0.5 | 0.25 | 0.05 | 0 | 0.4 | 0 | 0.4 | 0.2 |
| TEST PRODUCT 22 | 0.25 | 0.45 | 0.28 | 0.02 | 0 | 0 | 0.3 | 0.3 | 0.65 |
| TEST PRODUCT 23 | 0.3 | 0.4 | 0.25 | 0.05 | 0 | 0 | 0.4 | 0.4 | 0.3 |
| TEST PRODUCT 24 | 0.3 | 0.5 | 0.15 | 0.05 | 0 | 0 | 0.6 | 0.55 | 0.3 |
| TEST PRODUCT 25 | 0.4 | 0.4 | 0.17 | 0.03 | 0 | 0.3 | 0.3 | 0.6 | 0.4 |
| TEST PRODUCT 26 | 0.5 | 0.4 | 0.05 | 0.05 | 0 | 0.2 | 0.4 | 0.51 | 0.5 |
| TEST PRODUCT 27 | 0.5 | 0.45 | 0.03 | 0.02 | 0 | 0.2 | 0.3 | 0.45 | 0.5 |
| TEST PRODUCT 28 | 0.55 | 0.4 | 0.03 | 0.02 | 0 | 0.3 | 0.2 | 0.45 | 0.55 |
| TEST PRODUCT 29 | 0.6 | 0.05 | 0.3 | 0.05 | 0 | 0.1 | 0.4 | 0.45 | 0.6 |
| TEST PRODUCT 30 | 0.7 | 0.2 | 0.05 | 0.05 | 0 | 0.2 | 0.3 | 0.5 | 0.7 |
| TEST PRODUCT 31 | 0.7 | 0.25 | 0.03 | 0.02 | 0 | 0 | 0.3 | 0.3 | 0.7 |
| TEST PRODUCT 32 | 0.2 | 0.6 | 0.1 | 0.05 | 0.05 | 0 | 0.5 | 0.5 | 0.2 |
| TEST PRODUCT 33 | 0.25 | 0.55 | 0.15 | 0.01 | 0.04 | 0.3 | 0 | 0.3 | 0.25 |
| TEST PRODUCT 34 | 0.25 | 0.55 | 0.15 | 0.04 | 0.01 | 0.5 | 0 | 0.5 | 0.25 |
| TEST PRODUCT 35 | 0.3 | 0.55 | 0.05 | 0.05 | 0.05 | 0 | 0.5 | 0.5 | 0.3 |
| TEST PRODUCT 36 | 0.6 | 0.05 | 0.3 | 0.01 | 0.04 | 0 | 0.5 | 0.5 | 0.35 |
| TEST PRODUCT 37 | 0.4 | 0.4 | 0.1 | 0.05 | 0.05 | 0 | 0.4 | 0.4 | 0.4 |
| TEST PRODUCT 38 | 0.6 | 0.05 | 0.3 | 0.03 | 0.02 | 0.2 | 0.4 | 0.55 | 0.5 |
| TEST PRODUCT 39 | 0.5 | 0.45 | 0.02 | 0.02 | 0.01 | 0.1 | 0.5 | 0.5 | 0.5 |
| TEST PRODUCT 40 | 0.6 | 0.35 | 0.03 | 0.01 | 0.01 | 0.1 | 0.3 | 0.35 | 0.6 |

TABLE 1-continued

| COMPARISON PRODUCT | X (TARGET COMPOSITION) | | | | Cx | Ny | | Y (TARGET COMPOSITION) |
|---|---|---|---|---|---|---|---|---|
| | Cr (a) | Mo (b) | W (c) | Ti (f) | C (x) | N (y) | x + y | Cr (a) |
| COMPARISON PRODUCT 1 | 0.7 | 0.3 | 0 | 0 | 0 | 0.5 | 0.5 | 0.7 |
| COMPARISON PRODUCT 2 | 0 | 1 | 0 | 0 | 0.7 | 0 | 0.7 | 0 |
| COMPARISON PRODUCT 3 | 0.8 | 0.1 | 0 | 0.1 | 0.3 | 0.2 | 0.5 | 0.8 |
| COMPARISON PRODUCT 4 | 0 | 0 | 0 | 1 | 0.4 | 0.2 | 0.55 | 0 |
| COMPARISON PRODUCT 5 | 0.5 | 0 | 0 | 0.5 | 0.6 | 0.1 | 0.65 | 0.3 |
| COMPARISON PRODUCT 6 | 0.2 | 0.1 | 0.1 | 0.6 | 0.1 | 0.7 | 0.75 | 0.2 |

| | | B-LAYER THIN FILM COMPOSITION $X_{1-x-y-z}C_xN_yO_z$ | | | | | | | |
|---|---|---|---|---|---|---|---|---|---|
| | | COMPOSITION OF Y $Cr_aMo_bW_cV_dB_e$ | | | | Cx | Ny | Oz | |
| | TEST PRODUCT | Mo (b) | W (c) | V (d) | B (e) | C (x) | N (y) | O (z) | x + y + z |
| | TEST PRODUCT 1 | 0.6 | 0 | 0 | 0 | 0 | 0.25 | 0.26 | 0.51 |
| | TEST PRODUCT 2 | 0.55 | 0 | 0 | 0 | 0.1 | 0.2 | 0.02 | 0.32 |
| | TEST PRODUCT 3 | 0.5 | 0 | 0 | 0 | 0.2 | 0.1 | 0.05 | 0.35 |
| | TEST PRODUCT 4 | 0.45 | 0 | 0 | 0 | 0 | 0.25 | 0.1 | 0.35 |
| | TEST PRODUCT 5 | 0.4 | 0 | 0 | 0 | 0.25 | 0.05 | 0.15 | 0.45 |
| | TEST PRODUCT 6 | 0.35 | 0 | 0 | 0 | 0.1 | 0.24 | 0.18 | 0.52 |
| | TEST PRODUCT 7 | 0.3 | 0 | 0 | 0 | 0 | 0.5 | 0.05 | 0.55 |
| | TEST PRODUCT 8 | 0.3 | 0.3 | 0 | 0 | 0.1 | 0.3 | 0.1 | 0.5 |
| | TEST PRODUCT 9 | 0.3 | 0.3 | 0 | 0 | 0.2 | 0.15 | 0.1 | 0.45 |
| | TEST PRODUCT 10 | 0.05 | 0.3 | 0 | 0 | 0.3 | 0.2 | 0.05 | 0.55 |
| | TEST PRODUCT 11 | 0.3 | 0.2 | 0 | 0 | 0.4 | 0.18 | 0.02 | 0.6 |
| | TEST PRODUCT 12 | 0.35 | 0.1 | 0 | 0 | 0 | 0 | 0.6 | 0.6 |
| | TEST PRODUCT 13 | 0.35 | 0.05 | 0 | 0 | 0 | 0.23 | 0.32 | 0.55 |
| | TEST PRODUCT 14 | 0.3 | 0.05 | 0 | 0 | 0 | 0.05 | 0.55 | 0.6 |
| | TEST PRODUCT 15 | 0.35 | 0.05 | 0 | 0 | 0.3 | 0 | 0.05 | 0.35 |
| | TEST PRODUCT 16 | 0.55 | 0.05 | 0 | 0 | 0.5 | 0.08 | 0.02 | 0.6 |
| | TEST PRODUCT 17 | 0.6 | 0.05 | 0 | 0 | 0 | 0.4 | 0.05 | 0.45 |
| | TEST PRODUCT 18 | 0.6 | 0.02 | 0 | 0 | 0 | 0.2 | 0.15 | 0.35 |
| | TEST PRODUCT 19 | 0.45 | 0.03 | 0.02 | 0 | 0 | 0 | 0.3 | 0.3 |
| | TEST PRODUCT 20 | 0.38 | 0.02 | 0 | 0 | 0 | 0 | 0.35 | 0.35 |
| | TEST PRODUCT 21 | 0.5 | 0.25 | 0.05 | 0 | 0.4 | 0 | 0.05 | 0.45 |
| | TEST PRODUCT 22 | 0.05 | 0.25 | 0.05 | 0 | 0 | 0.25 | 0.05 | 0.3 |
| | TEST PRODUCT 23 | 0.4 | 0.25 | 0.05 | 0 | 0 | 0.35 | 0.1 | 0.45 |
| | TEST PRODUCT 24 | 0.5 | 0.15 | 0.05 | 0 | 0 | 0.55 | 0.05 | 0.6 |
| | TEST PRODUCT 25 | 0.4 | 0.17 | 0.03 | 0 | 0.25 | 0.2 | 0.05 | 0.5 |
| | TEST PRODUCT 26 | 0.4 | 0.05 | 0.05 | 0 | 0.15 | 0.2 | 0.02 | 0.37 |

TABLE 1-continued

| | | | | | | | | |
|---|---|---|---|---|---|---|---|---|
| TEST PRODUCT 27 | 0.45 | 0.03 | 0.02 | 0 | 0.2 | 0.25 | 0.01 | 0.46 |
| TEST PRODUCT 28 | 0.4 | 0.03 | 0.02 | 0 | 0.3 | 0.15 | 0.02 | 0.47 |
| TEST PRODUCT 29 | 0.3 | 0.08 | 0.02 | 0 | 0.05 | 0.4 | 0.05 | 0.5 |
| TEST PRODUCT 30 | 0.2 | 0.05 | 0.05 | 0 | 0.2 | 0.3 | 0.1 | 0.6 |
| TEST PRODUCT 31 | 0.05 | 0.23 | 0.02 | 0 | 0 | 0 | 0.6 | 0.6 |
| TEST PRODUCT 32 | 0.6 | 0.1 | 0.05 | 0.05 | 0 | 0 | 0.3 | 0.3 |
| TEST PRODUCT 33 | 0.55 | 0.15 | 0.01 | 0.04 | 0.3 | 0 | 0.05 | 0.35 |
| TEST PRODUCT 34 | 0.55 | 0.15 | 0.04 | 0.01 | 0.5 | 0 | 0.01 | 0.51 |
| TEST PRODUCT 35 | 0.55 | 0.05 | 0.05 | 0.05 | 0 | 0.5 | 0.05 | 0.55 |
| TEST PRODUCT 36 | 0.5 | 0.05 | 0.05 | 0.05 | 0 | 0.5 | 0.01 | 0.51 |
| TEST PRODUCT 37 | 0.4 | 0.1 | 0.05 | 0.05 | 0 | 0.4 | 0.05 | 0.45 |
| TEST PRODUCT 38 | 0.4 | 0.05 | 0.03 | 0.02 | 0.2 | 0.35 | 0.01 | 0.56 |
| TEST PRODUCT 39 | 0.45 | 0.03 | 0.02 | 0.01 | 0.05 | 0.45 | 0.05 | 0.55 |
| TEST PRODUCT 40 | 0.05 | 0.3 | 0.03 | 0.02 | 0.05 | 0.3 | 0.05 | 0.4 |

| | Y (TARGET COMPOSITION) | | | Cx | Ny | Oz | |
|---|---|---|---|---|---|---|---|
| COMPARISON PRODUCT | Mo (b) | W (c) | Ti (f) | C (x) | N (y) | O (z) | x + y + z |
| COMPARISON PRODUCT 1 | 0.3 | 0 | 0 | 0.00 | 0.00 | 0.10 | 0.10 |
| COMPARISON PRODUCT 2 | 1 | 0 | 0 | 0.00 | 0.00 | 0.50 | 0.50 |
| COMPARISON PRODUCT 3 | 0.1 | 0 | 0.1 | 0.80 | 0.00 | 0.00 | 0.80 |
| COMPARISON PRODUCT 4 | 0 | 0 | 1 | 0.50 | 0.20 | 0.00 | 0.70 |
| COMPARISON PRODUCT 5 | 0.2 | 0 | 0.5 | 0.00 | 0.65 | 0.00 | 0.65 |
| COMPARISON PRODUCT 6 | 0.1 | 0.1 | 0.6 | 0.00 | 0.15 | 0.35 | 0.50 |

TABLE 2

| | FILM THICKNESS | | | | | | |
|---|---|---|---|---|---|---|---|
| TEST PRODUCT AND COMPARISON PRODUCT | A-LAYER (nm) | B-LAYER (nm) | TOTAL FILM THICKNESS (μm) | HARDNESS H (Gpa) | FRICTION COEFFICIENT μ | ABRASION DEPTH (nm) | WELDING RESISTANCE |
| TEST PRODUCT 1 | 2 | 2 | 0.10 | 28.0 | 0.25 | 705 | ○ |
| TEST PRODUCT 2 | 2 | 5 | 0.12 | 29.7 | 0.26 | 692 | ○ |
| TEST PRODUCT 3 | 10 | 2 | 2.20 | 32.0 | 0.26 | 504 | ○ |
| TEST PRODUCT 4 | 25 | 10 | 0.60 | 35.0 | 0.20 | 480 | ○ |
| TEST PRODUCT 5 | 30 | 20 | 1.50 | 29.9 | 0.20 | 600 | ○ |
| TEST PRODUCT 6 | 100 | 200 | 3.50 | 32.1 | 0.23 | 540 | ○ |
| TEST PRODUCT 7 | 200 | 300 | 4.80 | 29.6 | 0.28 | 570 | ○ |
| TEST PRODUCT 8 | 350 | 400 | 5.50 | 33.7 | 0.30 | 599 | ○ |
| TEST PRODUCT 9 | 50 | 20 | 0.24 | 29.1 | 0.28 | 662 | ○ |
| TEST PRODUCT 10 | 800 | 2 | 8.02 | 33.0 | 0.28 | 449 | ○ |
| TEST PRODUCT 11 | 1000 | 50 | 9.45 | 34.0 | 0.21 | 309 | ○ |
| TEST PRODUCT 12 | 900 | 400 | 7.80 | 30.0 | 0.28 | 422 | ○ |
| TEST PRODUCT 13 | 400 | 150 | 5.50 | 32.5 | 0.22 | 349 | ⊚ |
| TEST PRODUCT 14 | 300 | 300 | 3.00 | 30.0 | 0.26 | 345 | ⊚ |
| TEST PRODUCT 15 | 200 | 15 | 2.30 | 38.7 | 0.22 | 449 | ⊚ |
| TEST PRODUCT 16 | 150 | 5 | 3.05 | 39.0 | 0.20 | 423 | ○ |
| TEST PRODUCT 17 | 50 | 2 | 3.24 | 36.0 | 0.34 | 410 | ⊚ |
| TEST PRODUCT 18 | 30 | 2 | 9.60 | 32.0 | 0.33 | 499 | ○ |
| TEST PRODUCT 19 | 10 | 10 | 3.30 | 30.0 | 0.31 | 489 | ○ |
| TEST PRODUCT 20 | 5 | 2 | 7.00 | 31.0 | 0.22 | 495 | ○ |
| TEST PRODUCT 21 | 30 | 10 | 2.30 | 36.8 | 0.24 | 501 | ○ |
| TEST PRODUCT 22 | 2 | 20 | 3.60 | 35.0 | 0.26 | 610 | ○ |

TABLE 2-continued

| TEST PRODUCT AND COMPARISON PRODUCT | FILM THICKNESS | | TOTAL FILM THICKNESS (μm) | HARDNESS H (Gpa) | FRICTION COEFFICIENT μ | ABRASION DEPTH (nm) | WELDING RESISTANCE |
|---|---|---|---|---|---|---|---|
| | A-LAYER (nm) | B-LAYER (nm) | | | | | |
| TEST PRODUCT 23 | 70 | 50 | 0.17 | 33.0 | 0.28 | 690 | ○ |
| TEST PRODUCT 24 | 120 | 200 | 4.40 | 36.0 | 0.21 | 650 | ◎ |
| TEST PRODUCT 25 | 150 | 100 | 4.00 | 37.9 | 0.23 | 710 | ◎ |
| TEST PRODUCT 26 | 2 | 50 | 5.10 | 33.0 | 0.22 | 540 | ◎ |
| TEST PRODUCT 27 | 35 | 2 | 3.90 | 36.0 | 0.20 | 590 | ○ |
| TEST PRODUCT 28 | 40 | 10 | 2.90 | 34.0 | 0.24 | 505 | ○ |
| TEST PRODUCT 29 | 15 | 8 | 3.10 | 37.5 | 0.21 | 530 | ◎ |
| TEST PRODUCT 30 | 8 | 2 | 9.00 | 38.3 | 0.25 | 493 | ○ |
| TEST PRODUCT 31 | 100 | 50 | 0.90 | 29.0 | 0.27 | 491 | ◎ |
| TEST PRODUCT 32 | 10 | 20 | 1.40 | 31.0 | 0.21 | 487 | ◎ |
| TEST PRODUCT 33 | 50 | 50 | 5.90 | 38.0 | 0.17 | 419 | ◎ |
| TEST PRODUCT 34 | 10 | 25 | 5.60 | 39.6 | 0.18 | 440 | ○ |
| TEST PRODUCT 35 | 350 | 200 | 7.50 | 38.0 | 0.22 | 400 | ◎ |
| TEST PRODUCT 36 | 150 | 15 | 6.30 | 36.0 | 0.25 | 380 | ◎ |
| TEST PRODUCT 37 | 200 | 350 | 5.50 | 35.0 | 0.24 | 360 | ◎ |
| TEST PRODUCT 38 | 750 | 500 | 4.00 | 35.0 | 0.23 | 490 | ◎ |
| TEST PRODUCT 39 | 80 | 20 | 5.50 | 34.0 | 0.22 | 450 | ◎ |
| TEST PRODUCT 40 | 20 | 2 | 4.20 | 35.0 | 0.22 | 420 | ◎ |
| COMPARISON PRODUCT 1 | 1500 | 800 | 11.50 | 20.0 | 0.80 | 1030 | X |
| COMPARISON PRODUCT 2 | 1 | 2 | 0.09 | 15.0 | 0.65 | 1200 | X |
| COMPARISON PRODUCT 3 | 1100 | 10 | 6.66 | 18.0 | 0.50 | 990 | X |
| COMPARISON PRODUCT 4 | 500 | 900 | 8.40 | 32.0 | 0.60 | 1100 | X |
| COMPARISON PRODUCT 5 | 50 | 2 | 5.40 | 33.0 | 0.65 | 1260 | X |
| COMPARISON PRODUCT 6 | 10 | 4 | 8.40 | 25.0 | 0.46 | 810 | X |

As described in Table 2, all the test products 1 to 40 coated with the films satisfying the requirements of the hard film 10 have the film hardness H of 28.0 GPa or more. In the nanoindentation method, the hardness is evaluated as being soft at 15 to 20 GPa, hard at 30 GPa or more, and brittle at 50 to 60 GPa.

Figure 6:
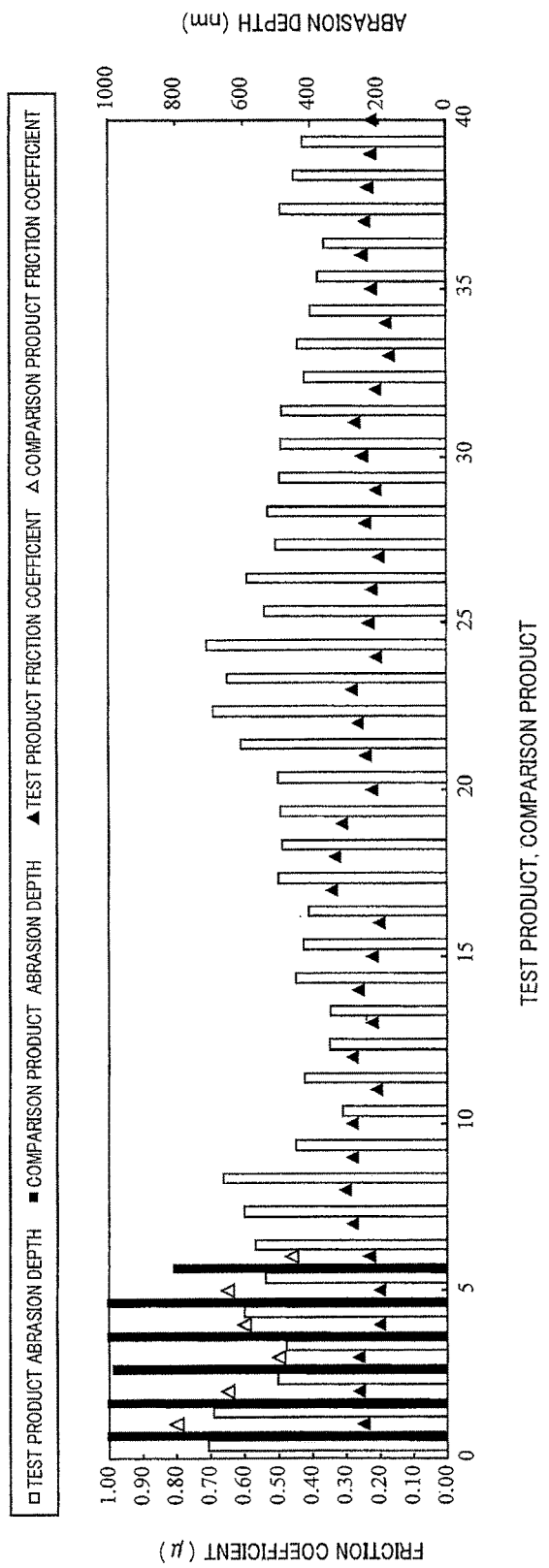
FIG. 6 is a graph showing a friction coefficient and an abrasion depth acquired in the friction abrasion test for each of test products and comparison products.

FIG. 6 is a graph showing the friction coefficient μ and the abrasion depth (nm) acquired in the friction abrasion test for each of the test products 1 to 40 and the comparison products 1 to 6. Therefore, FIG. 6 graphically shows the friction coefficient μ and the abrasion depth (nm) of Table 2. In FIG. 6, the horizontal axis denotes the number of each of the test products 1 to 40 and the comparison products 1 to 6, the left vertical axis denotes the friction coefficient μ of the test products 1 to 40 and the comparison products 1 to 6, and the right vertical axis denotes the abrasion depth (nm) of the test products 1 to 40 and the comparison products 1 to 6. As shown in Table 2 and FIG. 6, all the test products 1 to 40 coated with the films satisfying the requirements of the hard film 10 have the friction coefficients μ within 0.34 or less and the abrasion depths (nm) within 710 nm or less, respectively.

Specifically, from the above results, the hard film 10 is formed by alternately laminating two or more layers that are the one or more A-layers 22 made of $(Cr_aMo_bW_cV_dB_e)_{1-x-y}C_xN_y$ as nitride, carbide, or carbonitride and the one or more B-layers 24 made of $(Cr_aMo_bW_cB_e)_{1-x-y-z}C_xN_yO_z$ as oxide, oxynitride, oxycarbide, or oxycarbonitride with the control of composition ratios related to Cr, Mo, W, V, and B and the control of the respective reactant gases during film formation or only through the control of the respective reactant gases during film formation; the atom ratios a, b, c, d, e=1−a−b−c−d, x+y, and y related to the A-layers 22 satisfy $0.2 \leq a \leq 0.7$, $0.05 \leq b \leq 0.6$, $0 \leq c \leq 0.3$, $0 \leq d \leq 0.05$, $0 \leq e \leq 0.05$, $0.3 \leq x+y \leq 0.6$, $0 \leq y \leq 0.6$, respectively; the atom ratios a, b, c, d, e=1−a−b−c−d, x, y, z, and x+y+z related to the B-layers 24 satisfy $0.2 \leq a \leq 0.7$, $0.05 \leq b \leq 0.6$, $0 \leq c \leq 0.3$, $0 \leq d \leq 0.05$, $0 \leq e \leq 0.05$, $0 \leq x \leq 0.6$, $0 \leq y \leq 0.6$, $0 \leq z \leq 0.6$, and $0.3 \leq x+y+z \leq 0.6$, respectively; the film thickness D1 of each of the A-layers 22 is within a range of 2 nm or more to 1000 nm or less; the film thickness D2 of each of the B-layers 24 is within a range of 2 nm or more to 500 nm or less; the total film thickness D is within a range of 0.1 μm or more to 10.0 μm or less; and the test products 1 to 40 coated with the hard film 10 have the film hardness H of 28.0 GPa or more as well as the friction coefficient μ and the abrasion depth (nm) of 0.34 or less and 710 nm or less, respectively.

In contrast, the comparison product 1 is a multi-layer film with the total film thickness of 11.50 μm formed by alternate two-layer lamination of A-layers made of $(Cr_{0.7}Mo_{0.3})_{0.5}N_{0.5}$ with the film thickness of 1500 nm and B-layers made of $(Cr_{0.7}Mo_{0.3})O_{0.1}$ with the film thickness of 800 nm; the B-layers have the sum x+y+z of the atom ratios of carbon (C), nitrogen (N), and oxygen (O) of 0.10 and therefore the sum x+y+z of the atom ratios related to the B-layers 24 of the hard film 10 is beyond the range of $0.3 \leq x+y+z \leq 0.6$; and the respective film thicknesses and the total film thickness of the A-layers and the B-layers do not satisfy the respective ranges of 2 nm or more to 1000 nm or less related to the film thickness D1 of the A-layer 22, 2 nm or more to 500 nm or less related to the film thickness D2 of the B-layer 24, and 0.1 μm or more to 10.0 μm or less related to the total film thickness D of the hard film 10. Therefore, the comparison product 1 has the film hardness H of 20.0 GPa, which is smaller as compared to the test products, and has the friction coefficient μ of 0.80 and the abrasion depth of 1030 nm, which are larger values as compared to the test products. From these results, particularly, it is verified that the B-layer 24 should have the sum x+y+z of the atom ratios of carbon (C), nitrogen (N), and oxygen (O) of 0.3 or more, that the film thickness D1 of the A-layer 22 should be 1000 nm or less, that the film thickness D2 of the B-layer 24 should be 500 nm or less, and that the total film thickness D should be 10.0 μm or less, and the significance of the numerical value ranges related to the present invention is confirmed.

The comparison product 2 is a multi-layer film with the total film thickness of 0.09 μm formed by alternate two-layer lamination of A-layers made of $Mo_{0.3}C_{0.7}$ with the film thickness of 1 nm and B-layers made of $Mo_{0.5}O_{0.5}$ with the film thickness of 2 nm; the A-layers do not contain chromium (Cr), have the atom ratio b of molybdenum (Mo) of 1 and the sum x+y of the atom ratios of carbon (C) and nitrogen (N) of 0.7, and therefore the requirements of $0.2 \le a \le 0.7$ of the atom ratio a of chromium (Cr), $0.05 \le b \le 0.6$ of the atom ratio b of molybdenum, and $0.3 \le x+y \le 0.6$ of the sum x+y of the atom ratios of the carbon (C) and nitrogen (N) related to the A-layers 22 of the hard film 10 are not satisfied; the B-layers do not contain chromium (Cr), have the atom ratio b of molybdenum (Mo) of 1, and therefore the requirements of $0.2 \le a \le 0.7$ of the atom ratio a of chromium (Cr) and $0.05 \le b \le 0.6$ of the atom ratio b of molybdenum related to the B-layers 24 of the hard film 10 are not satisfied; and the film thickness of the A-layers and the total film thickness are beyond the respective ranges of 2 nm or more to 1000 nm or less related to the film thickness D1 of the A-layer 22 and 0.1 μm or more to 10.0 μm or less of the total film thickness D of the hard film 10. Therefore, the comparison product 2 has the film hardness H of 15.0 GPa, which is a smaller value as compared to the test products, and has the friction coefficient μ of 0.65 and the abrasion depth of 1200 nm, which are larger values as compared to the test products. From these results, particularly, it is verified that the A-layer 22 should have the atom ratio a of chromium (Cr) of 0.2 or more, the atom ratio b of molybdenum (Mo) of 0.6 or less, and the sum x+y of the atom ratios of carbon (C) and nitrogen (N) of 0.6 or less, that the B-layer should have the atom ratio a of chromium (Cr) of 0.2 or more and the atom ratio b of molybdenum (Mo) of 0.6 or less, that the film thickness D1 of the A-layer 22 should be 2 nm or more, and that the total film thickness D should be 0.1 μm or more, and the significance of the numerical value ranges related to the present invention is confirmed.

The comparison product 3 is a multi-layer film with the total film thickness of 6.66 (μm) formed by alternate two-layer lamination of A-layers made of $(Tio_{0.1}Cr_{0.8}Mo_{0.1})_{0.5}C_{0.3}N_{0.2}$ with the film thickness of 1100 (nm) and B-layers made of $(Tio_{0.1}Cr_{0.8}Mo_{0.1})_{0.2}C_{0.8}$ with the film thickness of 10 (nm); the A-layers of the comparison product 3 contain titanium (Ti), have the atom ratio a of chromium (Cr) of 0.8, and therefore the A-layers of the comparison product 3 contain the element titanium (Ti) different from the thin film composition related to the A-layers 22 of the hard film 10 and the atom ratio a of chromium (Cr) does not satisfy $0.2 \le a \le 0.7$; the B-layers of the comparison product 3 contain Ti, have the atom ratio a of chromium (Cr) of 0.8 and the atom ratio x of carbon (C) of 0.8, do not contain oxygen (O), and have the sum x+y+z of the atom ratios of carbon (C), nitrogen (N), and oxygen (O) of 0.80, and therefore the B-layers of the comparison product 3 contain the element titanium (Ti) different from the thin film composition related to the B-layers 24 of the hard film 10, the atom ratio a of chromium (Cr) does not satisfy $0.2 \le a \le 0.7$, the atom ratio x of carbon (C) does not satisfy $0 \le x \le 0.6$, and the atom ratio z of oxygen (O) does not satisfy $0 \le z \le 0.6$, and the sum x+y+z of the atom ratios of carbon (C), nitrogen (N), and oxygen (O) does not satisfy the range of $0.3 \le x+y+z \le 0.6$; and the film thickness of the A-layer of the comparison product 3 does not satisfy the range of 2 nm or more to 1000 nm or less related to the A-layer 22 of the hard film 10. Therefore, the comparison product 3 has the film hardness H of 18.0 GPa, which is a smaller value as compared to the test products, and has the friction coefficient μ of 0.50 and the abrasion depth of 990 nm, which are larger values as compared to the test products. From these results, particularly, it is verified that the A-layer 22 should have the atom ratio a of chromium (Cr) of 0.7 or less, that the B-layer 24 should have the atom ratio a of chromium (Cr) of 0.7 or less, the atom ratio x of carbon (C) of 0.6 or less, and the sum x+y+z of the atom ratios of carbon (C), nitrogen (N), and oxygen (O) of 0.6 or less, and that the film thickness D1 of the A-layer 22 should be 1000 nm or less, and the significance of the numerical value ranges related to the present invention is confirmed.

The comparison product 4 is a multi-layer film with the total film thickness of 8.40 μm formed by alternate two-layer lamination of A-layers made of $Ti_{0.45}C_{0.4}N_{0.15}$ with the film thickness of 500 nm and B-layers made of $Ti_{0.3}C_{0.5}N_{0.2}$ with the film thickness of 900 nm; the A-layers of the comparison product 4 contain titanium (Ti) without containing chromium (Cr) and molybdenum (Mo), therefore the A-layers of the comparison product 4 contain the element titanium (Ti) different from the thin film composition related to the A-layers 22 of the hard film 10, and the atom ratio a of chromium (Cr) of the comparison product 4 does not satisfy $0.2 \le a \le 0.7$ and the atom ratio b of molybdenum (Mo) does not satisfy $0.05 \le b \le 0.6$; the B-layers of the comparison product 4 contain titanium (Ti), do not contain chromium (Cr) and molybdenum (Mo), do not contain oxygen (O), and have the sum x+y+z of the atom ratios of carbon (C), nitrogen (N), and oxygen (O) of 0.70, therefore the B-layers of the comparison product 4 contain the element titanium (Ti) different from the thin film composition related to the B-layer 24 of the hard film 10, and the atom ratio a of chromium (Cr) of the comparison product 4 does not satisfy the ranges of $0.2 \le a \le 0.7$, the atom ratio b of molybdenum (Mo) of the comparison product 4 does not satisfy $0.05 \le b \le 0.6$, the atom ratio z of oxygen (O) of the comparison product 4 does not satisfy $0 \le z \le 0.6$, and the sum x+y+z of the atom ratios of carbon (C), nitrogen (N), and oxygen (O) of the comparison product 4 does not satisfy $0.3 \le x+y+z \le 0.6$; and the film thickness of the B-layer of the comparison product 4 does not satisfy the range of 2 nm or more to 500 nm or less related to the B-layer 24 of the hard film 10. Therefore, although the film hardness H is 32.0 GPa, the comparison product 4 has the friction coefficient μ of 0.60 and the abrasion depth of 1100 nm, which are larger values as compared to the test products. From these results, particularly, it is verified that the A-layer 22 should have the atom ratio a of chromium (Cr) of 0.2 or more and the atom ratio b of molybdenum (Mo) of 0.05 or more, that the B-layer 24 should have the atom ratio a of chromium (Cr) of 0.2 or more, the atom ratio b of molybdenum (Mo) of 0.05 or more, the atom ratio z of oxygen (O) greater than 0, and the sum x+y+z of the atom ratios of carbon (C), nitrogen (N), and oxygen (O) of 0.6 or less, and that the film thickness D2 of the B-layer 24 should be 500 nm or less, and the significance of the numerical value ranges related to the present invention is confirmed.

The comparison product 5 is a multi-layer film with the total film thickness of 5.40 μm formed by alternate two-layer lamination of A-layers made of $(Cr_{0.5}Ti_{0.5})_{0.35}C_{0.6}N_{0.05}$ with the film thickness of 50 nm and B-layers made of $(Cr_{0.3}Mo_{0.2}Ti_{0.5})_{0.35}N_{0.65}$ with the film thickness of 2 nm; the A-layers of the comparison product 5 contain titanium (Ti), do not contain molybdenum (Mo), have the sum x+y of the atom ratios of carbon (C) and nitrogen (N) of 0.65, and therefore the A-layers of the comparison product 5 contain the element titanium (Ti) different from the thin film composition related to the A-layers 22 of the hard film 10, the atom ratio b of molybdenum (Mo) does not satisfy $0.05 \le b \le 0.6$ and the sum x+y of the atom ratios of carbon (C) and nitrogen (N) does not satisfy $0.3 \le x+y \le 0.6$; the B-layers of the comparison product 5 contain titanium (Ti), have the atom ratio y of nitrogen (N) of 0.65, do not contain oxygen (O), have the sum x+y+z of the atom ratios of carbon (C), nitrogen (N), and oxygen (O) of 0.65, therefore the B-layers of the comparison product 5 contain the element titanium (Ti) different from the thin film composition related to the B-layer 24 of the hard film 10, and the atom ratio y of nitrogen (N) does not satisfy the ranges of 0≤y≤0.6, the atom ratio z of oxygen (O) does not satisfy 0≤z≤0.6, and the sum x+y+z of the atom ratios of carbon (C), nitrogen (N), and oxygen (O) does not satisfy 0.3≤x+y+z≤0.6. Therefore, although the film hardness H is 33.0, the comparison product 5 has the friction coefficient μ of 0.65 and the abrasion depth of 1260 nm, which are larger values as compared to the test products. From these results, particularly, it is verified that the A-layer 22 should have the atom ratio of molybdenum (Mo) of 0.05 or more and the sum x+y of the atom ratios of carbon (C) and nitrogen (N) of 0.6 or less and that the B-layer 24 should have the atom ratio y of nitrogen (N) of 0.6 or less, the atom ratio z of oxygen (O) greater than 0, and the sum x+y+z of the atom ratios of carbon (C), nitrogen (N), and oxygen (O) of 0.6 or less, and the significance of the numerical value ranges related to the present invention is confirmed.

The comparison product 6 is a multi-layer film with the total film thickness of 8.40 μm formed by alternate two-layer lamination of A-layers made of $(Cr_{0.2}Mo_{0.1}W_{0.1}Ti_{0.6})_{0.25}C_{0.1}N_{0.65}$ with the film thickness of 10 nm and B-layers made of $(Cr_{0.2}Mo_{0.1}W_{0.1}Ti_{0.6})_{0.5}N_{0.15}O_{0.35}$ with the film thickness of 4 nm; the A-layers of the comparison product 6 contain titanium (Ti), have the atom ratio y of nitrogen (N) of 0.65, the sum x+y of the atom ratios of carbon (C) and nitrogen (N) of 0.65, and therefore the A-layers of the comparison product 6 contain the element titanium (Ti) different from the thin film composition related to the A-layer 22 of the hard film 10, and the atom ratio y of nitrogen (N) does not satisfy 0≤y≤0.6 and the sum x+y of the atom ratios of carbon (C) and nitrogen (N) does not satisfy 0.3≤x+y≤0.6; the B-layers of the comparison product 6 contain titanium (Ti) and therefore contain the element titanium (Ti) different from the thin film composition related to the B-layer 24 of the hard film 10. Therefore, the comparison product 6 has the film hardness H of 25.0 GPa, which is a smaller value as compared to the test products, and has the friction coefficient μ of 0.46 and the abrasion depth of 810 nm, which are larger values as compared to the test products. From these results, particularly, it is verified that the A-layer 22 should have the atom ratio y of nitrogen (N) of 0.6 or less and the sum x+y of the atom ratios of carbon (C) and nitrogen (N) of 0.6 or less, and the significance of the numerical value ranges related to the present invention is confirmed.

Figure 7:
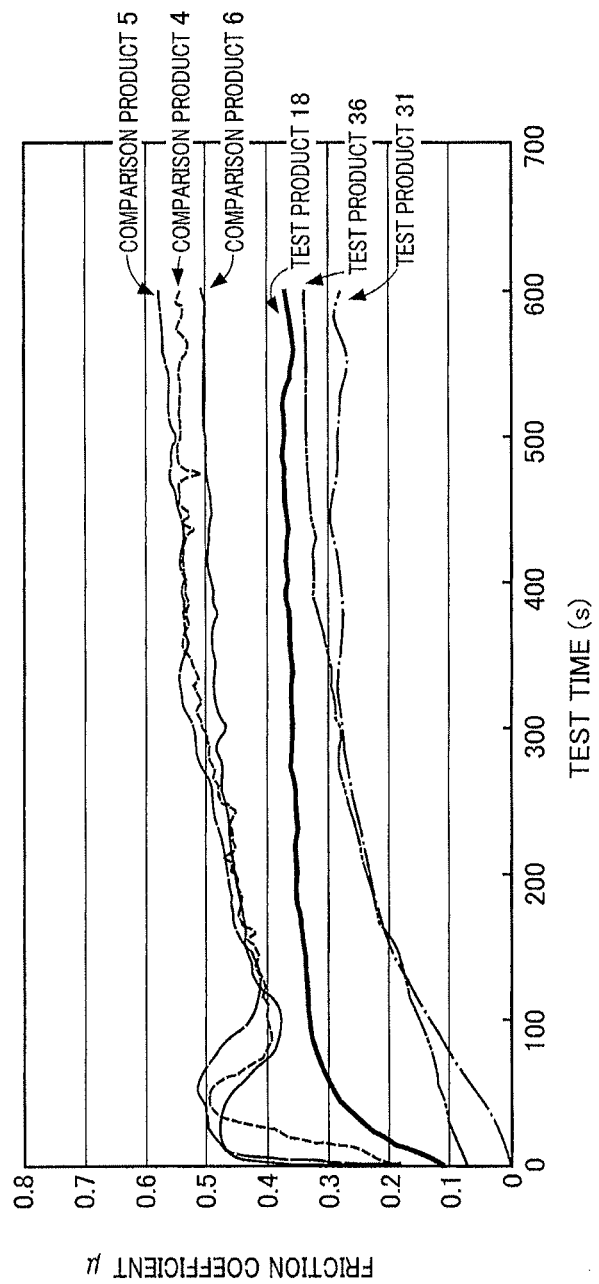
FIG. 7 is a graph of transition of the friction coefficients over the test time in the friction abrasion test of the hard film.

FIG. 7 is a graph of transition of moving average values of the friction coefficients μ over the test time in the friction abrasion test of the hard film 10. FIG. 7 includes the vertical axis indicative of the friction coefficient μ and the horizontal axis indicative of the elapsed time (s) from the test start and shows relations regarding the test products 18, 31, and 36 representative of the test products and the comparison products 4, 5, and 6 representative of the comparison products, respectively. In FIG. 7, the friction coefficients μ of the test products and the comparison products are indicated by a thick line for the test product 18, a dashed-dotted line for the test product 31, a dashed-two dotted line for the test product 36, a dotted line for the comparison product 4, a dashed line for the comparison product 5, and a thin line for the comparison product 6. Although all the test products 18, 31, 36 and the comparison products 4, 5, 6 have the friction coefficients stable from about 200 seconds after the test start until the test end, i.e., after 600 seconds have elapsed from the test start, the friction coefficients of the test products 18, 31, 36 converge to the vicinity of about 0.3, while the friction coefficients of the comparison products 4, 5, 6 converge to the vicinity of about 0.55. The test products 18, 31, 36 have the friction coefficients gently increasing from the test start until 200 seconds have elapsed, while the comparison products 4, 5, 6 show an phenomenon in which a friction coefficient once rises to the vicinity of 0.5 and then slightly drops after the test start and before 100 seconds have elapsed. This indicates that the abrasion resistance of the comparison products 4, 5, 6 is not sufficient.

The results of the film hardness test and the friction abrasion test show that the test products 1 to 40 shown in Table 2 provide larger values of the film hardness H and smaller values of the friction coefficient μ and the abrasion depth and have high hardness and favorable abrasion resistance, while the comparison products 1 to 6 deviating from the thin film composition, the ranges of the atom ratios of the elements, and the ranges of the respective film thicknesses and the total film thickness required for the hard film 10 have smaller film hardness H and larger values of the friction coefficient μ and the abrasion depth as compared to the test products 1 to 40 and have insufficient hardness and abrasion resistance.

Evaluation of welding in the friction abrasion test was performed. Welding resistance in Table 2 was evaluated as follows. Oxygen analysis was conducted with a scanning electron microscope (SEM) by using EDS component analysis to map an abrasion mark on the hard film formed due to friction with the work material 46 on the hemispherical end portion 48 of each of the test pieces 40 of the test products 1 to 40 and the comparison products 1 to 6 used in the friction abrasion test, thereby analyzing an oxide component and an amount thereof. The EDS component analysis enables visually distinguishing a region in which oxygen exists, i.e., a region in which oxide is generated, from the other regions. The welding resistance was evaluated from an oxide amount in the abrasion mark on the hard film of each of the test pieces 40 from the EDS component analysis. In particular, when no welding is present on the abrasion mark on the hard film, the welding resistance was evaluated as excellent (double circle); when the area of the welding portion is 20% or less of the area of the abrasion mark on the hard film, the welding resistance was evaluated as good (circle); and when the area of the welding portion is 50% or more of the area of the abrasion mark on the hard film, the welding resistance was evaluated as poor (cross mark). The abrasion marks on the hard films related to the test product 18 and test product 36 representative of the test products 1 to 40 and the comparison product 4 representative of the comparison products 1 to 6 were enlarged and observed with a microscope and a scanning electron microscope (SEM).

In Table 2, all the test products 1 to 40 coated with the hard film 10 are evaluated as excellent or good in terms of the welding resistance. In contrast, all the comparison products 1 to 6 not satisfying the conditions required for the hard film 10 are evaluated as poor in terms of the welding resistance.

Figure 8A:
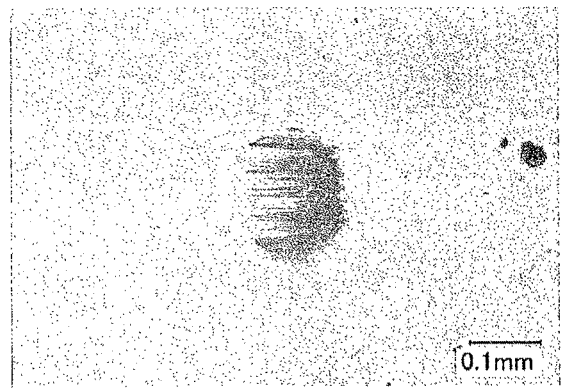
FIGS. 8A to 8C show photographs of an abrasion mark on the hard film on a hemispherical end portion of a test piece in the test product 36 used in the friction abrasion test.
Figure 8B:
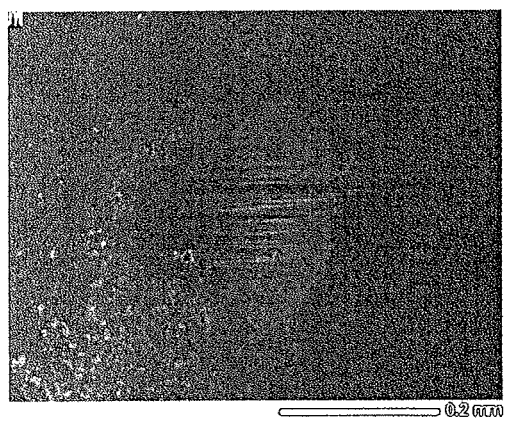
Figure 8C:
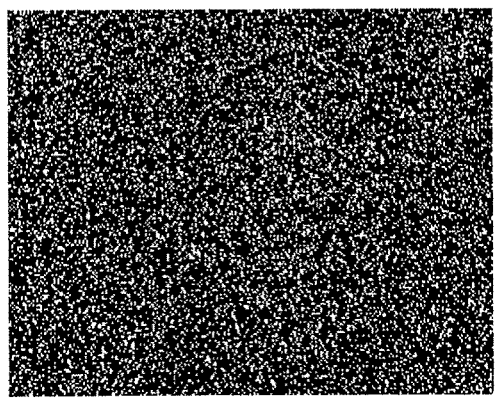
Figure 9A:
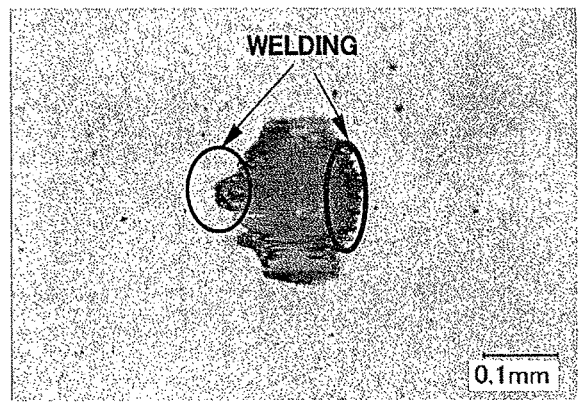
FIGS. 9A to 9C show photographs of an abrasion mark on the hard film on a hemispherical end portion of a test piece in the test product 18 used in the friction abrasion test.
Figure 9B:
Figure 9C:
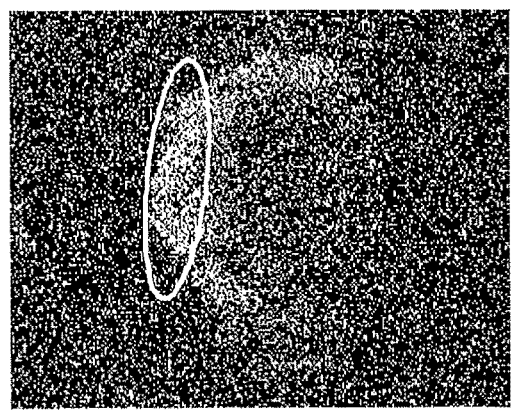
Figure 10A:
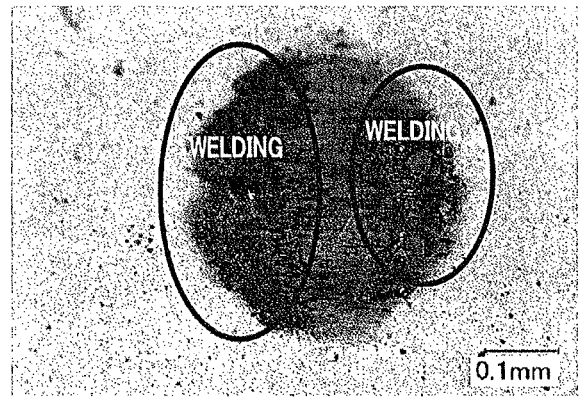
FIGS. 10A to 10C show photographs of an abrasion mark on the hard film on a hemispherical end portion of a test piece in the comparison product 4 used in the friction abrasion test.
Figure 10B:
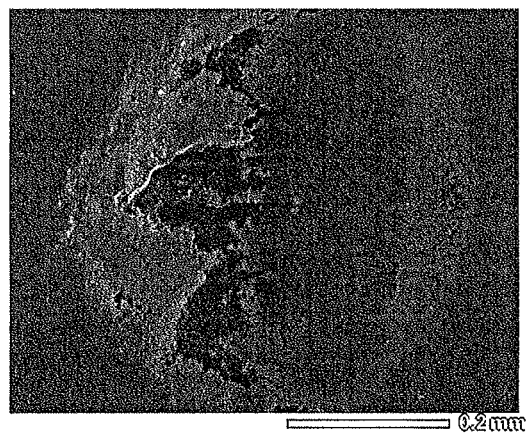
Figure 10C:
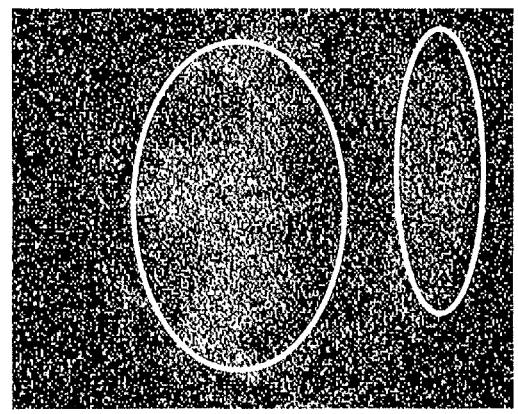

FIGS. 8A to 8C, 9A to 9C, and 10A to 10C show photographs of the abrasion marks on the hard films on the hemispherical end portions of the test pieces in the test product 36, the test product 18, and the comparison product 4 used in the friction abrasion test; FIGS. 8A, 9A, and 10A show the photographs taken by the microscope; FIGS. 8B, 9B, and 10B show the photographs taken by the scanning electron microscope (SEM); and FIGS. 8C, 9C, and 10C show the photographs of oxygen analysis results of the EDS analysis with the SEM. In Table 2 and FIGS. 8A, to 8C, the test product 36 coated with the hard film 10 and having the small friction coefficient μ of 0.25 and abrasion depth of 380 nm has almost no abrasion mark observed on the hard film 10, has no welding recognized in the EDS analysis result shown in FIG. 8C, and is therefore evaluated as excellent in terms of the welding resistance. In Table 2 and FIG. 9A, to 9C, the test product 18 coated with the hard film 10 and having the small friction coefficient μ of 0.33 and abrasion depth of 499 nm has welding observed in a range corresponding to 20% or less of the area of the abrasion mark on the abrasion mark on the hard film 10 in a region surrounded by a circle in FIGS. 9A and 9C and is therefore evaluated as good in terms of the welding resistance. In contrast, in Table 2 and FIGS. 10A to 10C, the comparison product 4 coated with the film not satisfying the conditions required for the hard film 10 and having the large friction coefficient μ of 0.60 and abrasion depth of 1100 nm has welding considered as an oxide of titanium (Ti) and an oxide of the carbide indenter observed in a range corresponding to 50% or more of the area of the abrasion mark on the hard film in a region surrounded by a circle in FIGS. 10A and 10C and is therefore evaluated as poor in terms of the welding resistance.

From the above evaluation of welding, it is considered that the test products 1 to 40 coated with the hard film 10 have low abrasion properties and favorable welding resistance because solid lubrication particles are generated through self-formation of respective oxides of molybdenum (Mo), tungsten (W), and vanadium (V) in the hard film due to abrasion.

Figure 11:
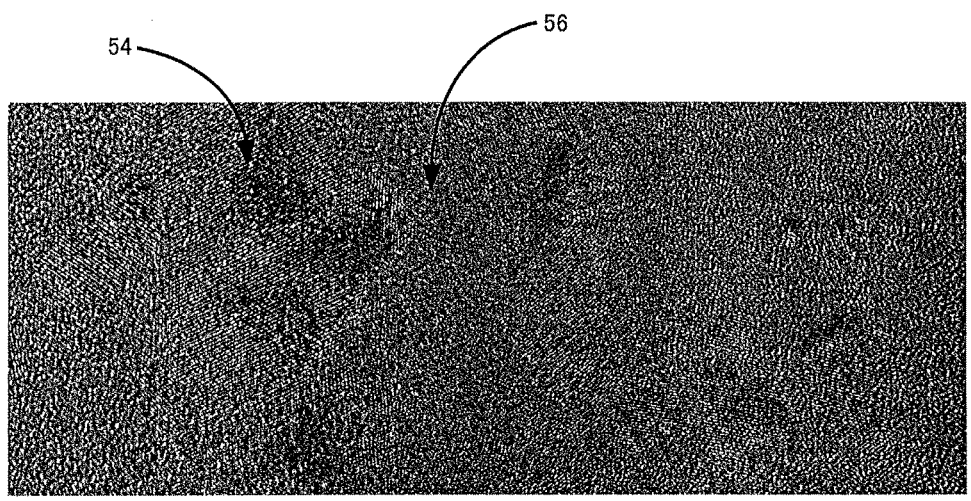
FIG. 11 shows a photograph of the B-layer in the hard film of the test product 1 taken by a transmission electron microscope (TEM).

FIG. 11 shows a photograph of a cross section of the B-layer 24 in the hard film 10 of the test product 1 taken by a transmission electron microscope (TEM). The B-layer 24 in the hard film 10 of the test product 1 has the thin film composition of $(Cr_{0.4}Mo_{0.6})_{0.49}N_{0.25}O_{0.26}$. The B-layer 24 is a region with cross stripes observed in FIG. 11 and has a crystal phase 54 made of fine crystal grains as well as an amorphous phase 56 containing oxygen (O) in the other region. The test product 1 having the B-layer 24 as described above has the high hardness and whose film hardness H is 28.0 GPa because of the presence of the crystal phase 54 made of the fine crystal grains, and has favorable abrasion resistance and welding resistance and whose friction coefficient μ is 0.25 and the abrasion depth is 705 nm since the presence of the amorphous phase 56 containing oxygen (O) facilitates the formation of the molybdenum (Mo) oxide due to abrasion.

As described above, according to the hard film 10 of this embodiment, i.e., the test products 1 to 40, the hard film is disposed on the surface of the tool base material 14 and is formed by alternately laminating two or more layers that are the one or more A-layers 22 made of nitride, carbide, or carbonitride of $(Cr_aMo_bW_cV_dB_e)_{1-x-y}C_xN_y$ and the one or more B-layers 24 made of oxide, oxynitride, oxycarbide, or oxycarbonitride of $(Cr_aMo_bW_cV_dB_e)_{1-x-y-z}C_xN_yO_z$ formed through the control of composition ratios related to Cr, Mo, W, V, and B and the control of the respective reactant gases during film formation or only through the control of the respective reactant gases during film formation; the atom ratios a, b, c, d, e=1−a−b−c−d, x+y, and y related to the A-layers 22 satisfy $0.2 \le a \le 0.7$, $0.05 \le b \le 0.6$, $0 \le c \le 0.3$, $0 \le d \le 0.05$, $0 \le e \le 0.05$, $0.3 \le x+y \le 0.6$, and $0 \le c \le 0.6$, respectively; the atom ratios a, b, c, d, e=1−a−b−c−d, x, y, z, and x+y+z related to the B-layers 24 satisfy $0.2 \le a \le 0.7$, $0.05 \le b \le 0.6$, $0 \le c \le 0.3$, $0 \le d \le 0.05$, $0 \le e \le 0.05$, $0 \le x \le 0.6$, $0 \le y \le 0.6$, $0 \le z \le 0.6$, and $0.3 \le x+y+z \le 0.6$, respectively; the film thickness D1 of each of the A-layers 22 is within a range of 2 nm or more to 1000 nm or less; the film thickness D2 of each of the B-layers 24 is within a range of 2 nm or more to 500 nm or less; the total film thickness D is within a range of 0.1 μm or more to 10.0 μm or less; and therefore, the laminated A-layers 22 have nitride, carbide, or carbonitride of CrMoWVB formed therein and the laminated B-layers 24 have a microstructure made of oxide, oxycarbide, oxynitride, or oxycarbonitride of Cr, Mo, W, and V and B formed therein or a dual-phase structure of oxide, oxycarbide, oxynitride or oxycarbonitride of Cr, Mo, W, V and B formed therein between the crystal phase of the NaCl structure (such as δ-(Cr, Mo, W, V)N and γ-Mo₂N) 54 and the amorphous phase 56, so that the hard film 10 and the end mill 12 having high hardness and abrasion resistance can be acquired.

Although the present invention has been described in detail with reference to the tables and the drawings, the present invention can be implemented in other forms and may variously be modified without departing from the spirit thereof.

For example, in the embodiment, with regard to the order of lamination of the A-layers 22 and the B-layers 24 in the hard film 10, preferably, as shown in FIG. 2, the layers are laminated in the order of the A-layer 22, the B-layer 24, . . . , the A-layer 22, and the B-layer 24 from the tool base material 14. Therefore, the base layer (bottom layer contacting the tool base material 14) of the hard film 10 is the A-layer 22 and the surface layer (top layer of the hard film 10) is the B-layer 24; however, the order is not necessarily limited to this configuration and a certain effect of the present invention is provided even when the base layer is the B-layer 24 and the surface layer is the A-layer 22 or the B-layer 24 or when both the base layer and the surface layer are the A-layers 22.

Although the hard film 10 is used for coating the end mill 12 in the embodiment, this is not a limitation and, for example, the hard film 10 may be used for coating cutting tools such as drills, taps, and dies and metalworking tools such as metal processing dies for punching, bending, etc.

Although the hard film 10 is disposed by a sputtering apparatus when the end mill 12 is formed in the embodiment, this is not a limitation and, for example, other physical vapor deposition methods (PVD methods) such as an arc ion plating method and chemical vapor deposition methods such as a plasma CVD method and a thermal CVD method may be used for disposing the hard film 10.

REFERENCE SIGNS LIST

10: Hard film (Hard lubrication film)
12: End mill (Hard lubrication film coated tool)
22: A-layer
24: B-layer

The invention claimed is:
1. A hard lubrication film with which a surface of a base material is coated,
  the hard lubrication film having two or more alternately laminated layers that are one or more A-layers made of $(Cr_aMo_bW_cV_dB_e)_{1-x-y}C_xN_y$ and excluding Ti and one or more B-layers made of $(Cr_aMo_bW_cV_dB_e)_{1-x-y-z}C_xN_yO_z$ and excluding Ti, wherein atom ratios a, b, c, d, e=1−a−b−c−d, x+y, and y related to the A-layers satisfy $0.2 \leq a \leq 0.7$, $0.05 \leq b \leq 0.6$, $0 \leq c \leq 0.3$, $0 \leq d \leq 0.05$, $0 \leq e \leq 0.05$, $0.3 \leq x+y \leq 0.6$, and $0 \leq y \leq 0.6$, respectively, wherein atom ratios a, b, c, d, e=1−a−b−c−d, x, y, z, and x+y+z related to the B-layers satisfy $0.2 \leq a \leq 0.7$, $0.05 \leq b \leq 0.6$, $0 \leq c \leq 0.3$, $0 \leq d \leq 0.05$, $0 \leq e \leq 0.05$, $0 \leq x \leq 0.6$, $0 \leq y \leq 0.6$, $0 < z \leq 0.6$, and $0.3 \leq x+y+z \leq 0.6$, respectively, wherein the B-layers have a dual-phase structure in which a crystal phase and an amorphous phase are mixed, and wherein each of the A-layers has a film thickness within a range of 2 nm or more to 1000 nm or less, wherein each of the B-layers has a film thickness within a range of 2 nm or more to 500 nm or less, and wherein the hard lubrication film has a total film thickness within a range of 0.1 μm or more to 10.0 μm or less.

2. A hard lubrication film coated tool coated with the hard lubrication film according to claim 1.

3. The hard lubrication film according to claim 1, wherein the atom ratio c related to the A-layers satisfy $0 < c \leq 0.3$, and the atom ratio c related to the B-layers satisfy $0 < c \leq 0.3$.

4. The hard lubrication film according to claim 3, wherein the atom ratio d related to the A-layers satisfy $0 < d \leq 0.05$, and the atom ratio d related to the B-layers satisfy $0 < d \leq 0.05$.

5. The hard lubrication film according to claim 4, wherein the atom ratio e related to the A-layers satisfy $0 < e \leq 0.05$, and the atom ratio e related to the B-layers satisfy $0 < e \leq 0.05$.

* * * * *